US008641174B2

(12) United States Patent
Hamada

(10) Patent No.: US 8,641,174 B2
(45) Date of Patent: Feb. 4, 2014

(54) LIQUID EJECTION HEAD, LIQUID EJECTION DEVICE

(75) Inventor: Yasuaki Hamada, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 12 days.

(21) Appl. No.: 13/037,631

(22) Filed: Mar. 1, 2011

(65) Prior Publication Data

US 2011/0216134 A1 Sep. 8, 2011

(30) Foreign Application Priority Data

Mar. 2, 2010 (JP) ................................. 2010-045973
Jan. 26, 2011 (JP) ................................. 2011-014619

(51) Int. Cl.
*H01L 41/00* (2013.01)
*H02N 2/00* (2006.01)
*B41J 2/045* (2006.01)

(52) U.S. Cl.
USPC ........................................... 347/68; 310/311

(58) Field of Classification Search
None
See application file for complete search history.

(56) References Cited

U.S. PATENT DOCUMENTS

| 4,755,493 | A | 7/1988 | Takeuchi et al. |
|---|---|---|---|
| 4,826,787 | A | 5/1989 | Muto et al. |
| 6,376,090 | B1 | 4/2002 | Kijima |
| 6,626,526 | B2 * | 9/2003 | Ueki et al. .................. 347/72 |
| 6,784,600 | B2 | 8/2004 | Klee et al. |
| 7,727,322 | B2 | 6/2010 | Noguchi |
| 7,901,800 | B2 | 3/2011 | Shibata et al. |
| 8,102,100 | B2 | 1/2012 | Hamada et al. |
| 8,183,594 | B2 | 5/2012 | Ishida et al. |
| 8,395,302 | B2 | 3/2013 | Hamada et al. |
| 2002/0030723 | A1 | 3/2002 | Sumi et al. |
| 2005/0280671 | A1 | 12/2005 | Silverbrook et al. |
| 2006/0222872 | A1 | 10/2006 | Higuchi et al. |
| 2007/0241642 | A1 | 10/2007 | Miyazawa et al. |
| 2009/0058954 | A1 | 3/2009 | Arakawa et al. |
| 2009/0075066 | A1 | 3/2009 | Shibata et al. |
| 2009/0230211 | A1 | 9/2009 | Kobayashi et al. |
| 2009/0243438 | A1 | 10/2009 | Hamada et al. |
| 2011/0298336 | A1 | 12/2011 | Saito et al. |

FOREIGN PATENT DOCUMENTS

| CN | 1931791 A | 3/2007 |
|---|---|---|
| CN | 101393960 A | 3/2009 |
| CN | 101552317 A | 10/2009 |
| JP | 2001-223404 A | 8/2001 |
| JP | 2009252789 A * | 10/2009 |
| JP | 2010-018452 A | 1/2010 |
| WO | WO-2010/114148 A1 | 10/2010 |

OTHER PUBLICATIONS

Sosnowska et al., Crystal structure and spiral magnetic ordering of $BiFeO_3$ doped with manganese, Jul. 6, 2001, Appl. Phys. A 75 (Suppl), S1040-S1042 (2002).*

Extended European Search Report for the corresponding European Patent Application No. 11156108.0 dated Dec. 17, 2012.

(Continued)

*Primary Examiner* — Matthew Luu
*Assistant Examiner* — Erica Lin
(74) *Attorney, Agent, or Firm* — Global IP Counselors, LLP

(57) ABSTRACT

A liquid ejection head including a piezoelectric element having a piezoelectric layer and electrodes The piezoelectric layer is 3 μm or less in thickness. The piezoelectric layer is made of a piezoelectric material including bismuth manganate ferrate and barium titanate. The piezoelectric layer is preferentially oriented with the (110) plane.

6 Claims, 10 Drawing Sheets

(56) References Cited

OTHER PUBLICATIONS

Naoyuki Ito et al.; "Fabrication and Characterization of BiFeO3-BaTiO3 Ceramics by Solid State Reaction"; Ferroelectrics, vol. 356, No. 1; Jan. 1, 2007, pp. 19-23.

Sakamoto et al.; "Preparation and Characterization of Perovskite BiFeO3-BaTiO3 Ceramics"; 16th International Symposium on Applications of Ferroelectrics 2007; May 1, 2007; pp. 426-427.
Wu et al.; "Improved ferroelectric behavior in (110) oriented BiFeO3 thin films"; Journal of Applied Physics, American Institute of Physics; vol. 107, No. 3; Feb. 2, 2010; pp. 34103-34103.

* cited by examiner

LIQUID EJECTION HEAD, LIQUID EJECTION DEVICE

CROSS-REFERENCE TO RELATED APPLICATIONS

This application claims priority to Japanese Patent Application No. 2010-045973 filed on Mar. 2, 2010 and Japanese Patent Application No. 2011-014619 filed on Jan. 26, 2011. The entire disclosures of Japanese Patent Application Nos. 2010-045973 and 2011-014619 are hereby incorporated herein by reference.

BACKGROUND

1. Technical Field

The present invention relates to a liquid ejection head and a liquid ejection device provided with piezoelectric elements having electrodes and a piezoelectric layer of a piezoelectric material, and adapted to expel droplets of liquid from nozzle openings.

2. Related Art

One known structure for a piezoelectric element has a piezoelectric layer of a piezoelectric material that exhibits an electrical-mechanical conversion function, for example, a crystallized dielectric material, sandwiched by two electrodes. Piezoelectric elements of this kind may be installed in a liquid ejection head to serve as actuator devices that oscillate in flexural oscillation mode, for example. One typical example of a liquid ejection head, for example, is an inkjet recording head that includes oscillator plates which partially define pressure generation chambers communicating with nozzle openings for expelling ink droplets, the head being adapted to pressurize the ink of the pressure generation chambers through deformation of the oscillator plates by piezoelectric elements in order to expel ink droplets from the nozzle openings. The piezoelectric elements installed in such an inkjet head are produced, for example, by forming a uniform piezoelectric material layer over the entire surface of the oscillator plate by deposition technique, and etching away the piezoelectric material layer by a lithography process into shapes that correspond to the pressure generation chambers, to form an independent piezoelectric element for each of the pressure generation chambers.

An example of a piezoelectric material used in such piezoelectric elements is lead zirconate titanate (PZT) (see Japanese Laid-Open Patent Application Publication No. 2001-223404).

SUMMARY

However, reduced lead levels in piezoelectric materials are increasingly desirable due to environmental concerns. An example of a lead-free piezoelectric material is $BiFeO_3$, which has a perovskite structure represented by $ABO_3$, for example. A problem with such $BiFeO_3$ based piezoelectric materials which contain Bi and Fe is that piezoelectric characteristics (strain rate) tend to be low owing to the relatively low relative dielectric constant. This problem is not limited to liquid ejection heads typified by inkjet heads, and similar problems are encountered with piezoelectric elements of actuator devices installed in other types of devices as well.

With the foregoing in view, it is an object of the present invention to provide a liquid ejection head, a liquid ejection device, and a piezoelectric element that are both environmentally friendly and afford a high relative dielectric constant.

A liquid ejection head according to a first aspect of the present invention includes a piezoelectric element having a piezoelectric layer and electrodes provided on the piezoelectric layer. The piezoelectric layer is 3 µm or less in thickness. The piezoelectric layer is made of a piezoelectric material containing a perovskite compound including bismuth manganate ferrate and barium titanate. The piezoelectric layer is preferentially oriented with the (110) plane.

According to this aspect, a liquid ejection head having a piezoelectric layer with low lead content, that is, a reduced lead content, and a high relative dielectric constant is obtained using a piezoelectric layer that is 3 µm or less in thickness, is composed of a piezoelectric material containing a perovskite compound including bismuth manganate ferrate and barium titanate, and is preferentially oriented with the (110) plane.

The electrodes may include a platinum film oriented with the (111) plane, and the piezoelectric layer may be formed on the platinum film. Even if the electrodes have a platinum film oriented with the (111) plane, the liquid ejection head according to such a configuration will have a piezoelectric layer that is oriented with the (110) plane, while also having a low lead content and a high relative dielectric constant.

The piezoelectric layer is preferably a spontaneously oriented film. Such a configuration makes it possible to provide a liquid ejection head having a piezoelectric layer obtained without having to orient the material under an applied magnetic field, provide the substrate of the piezoelectric film with a layer for controlling orientation, or perform another similar operation.

The piezoelectric layer preferably further includes $SiO_2$. Such a configuration makes it possible to provide a liquid ejection head having piezoelectric elements with excellent insulating properties.

The piezoelectric layer preferably contains $SiO_2$ in an amount of 0.5 mol % or more and 5 mol % or less with respect to the perovskite compound. Such a configuration makes it possible to provide a liquid ejection head having a piezoelectric layer with dependably low lead content, high relative dielectric constant, and excellent insulating properties.

A liquid ejection device according to another aspect of the present invention includes the liquid ejection head of the preceding aspect. According to this aspect, the liquid ejection device is provided with a liquid ejection head having a piezoelectric layer with low lead content and a high relative dielectric constant, thereby affording a device with excellent ejection characteristics and negligible environmental impact.

A piezoelectric element according to another aspect of the present invention includes a piezoelectric layer and an electrode provided on the piezoelectric layer. The piezoelectric element is characterized in that the piezoelectric layer is 3 µM or less in thickness. The piezoelectric layer is made of a piezoelectric material containing a perovskite compound including bismuth manganate ferrate and barium titanate. The piezoelectric layer is preferentially oriented with the (110) plane. According to this aspect, a piezoelectric element having a piezoelectric layer with low lead content and a high relative dielectric constant is obtained using a piezoelectric layer that is 3 µm or less in thickness, is composed of a piezoelectric material containing a perovskite compound including bismuth manganate ferrate and barium titanate, and is preferentially oriented with the (110) plane.

BRIEF DESCRIPTION OF THE DRAWINGS

Referring now to the attached drawings which form a part of this original disclosure.

DETAILED DESCRIPTION OF EXEMPLARY EMBODIMENTS

First Embodiment

Figure 1:
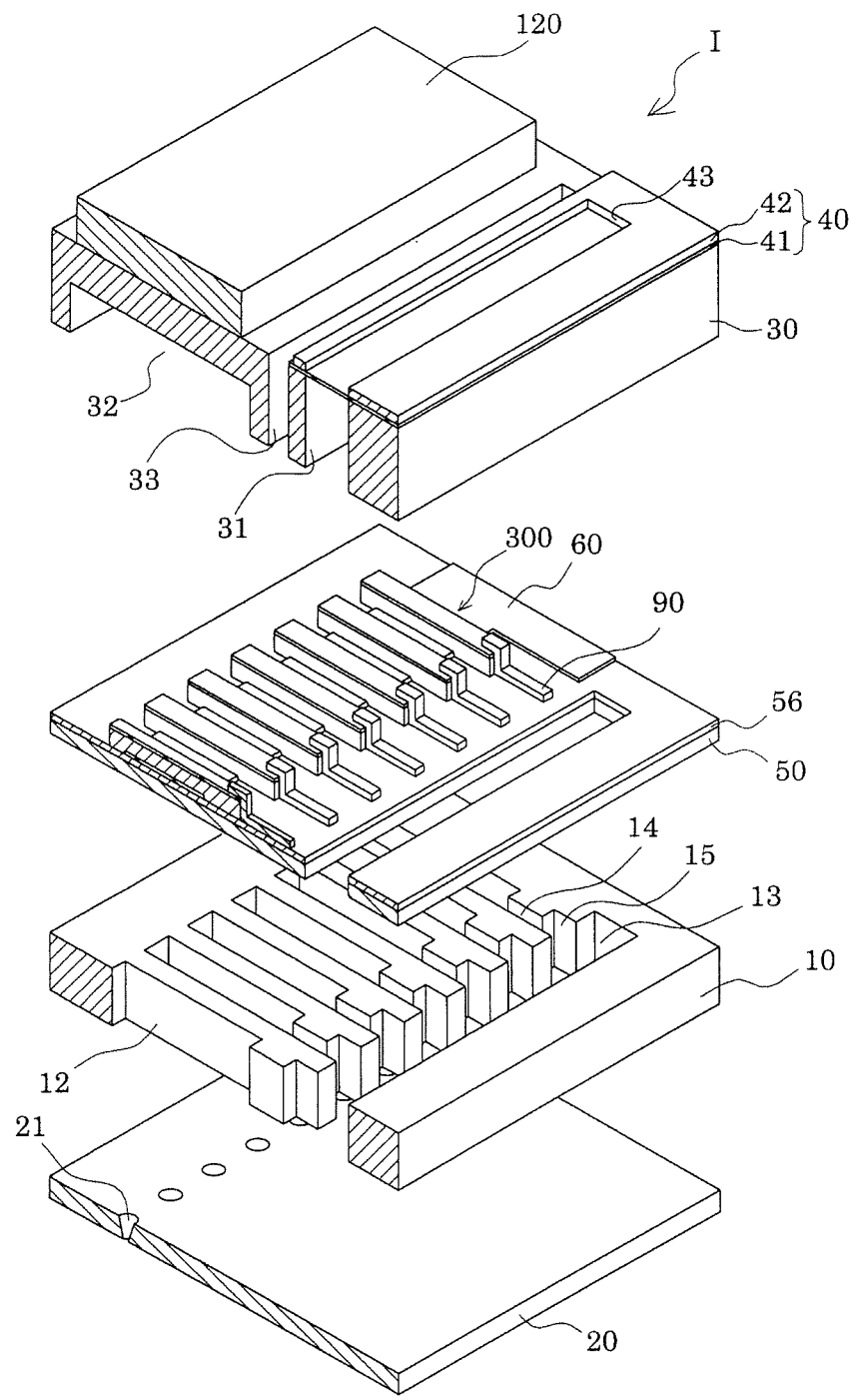
FIG. 1 is an exploded perspective view of a simplified configuration of a recording head according to a first embodiment.
Figure 2A:
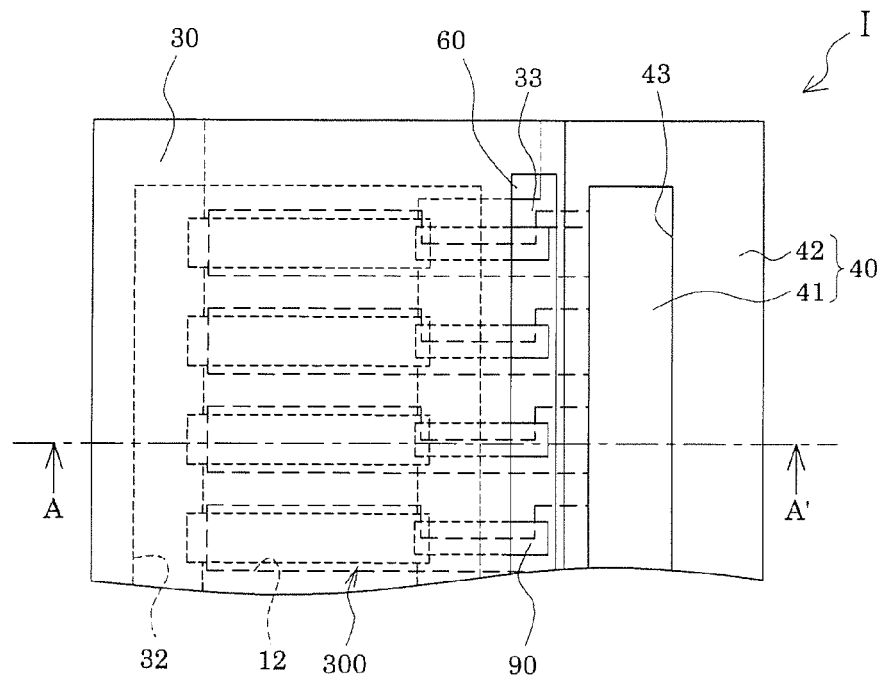
FIG. 2A is a plan view of the recording head.
Figure 2B:
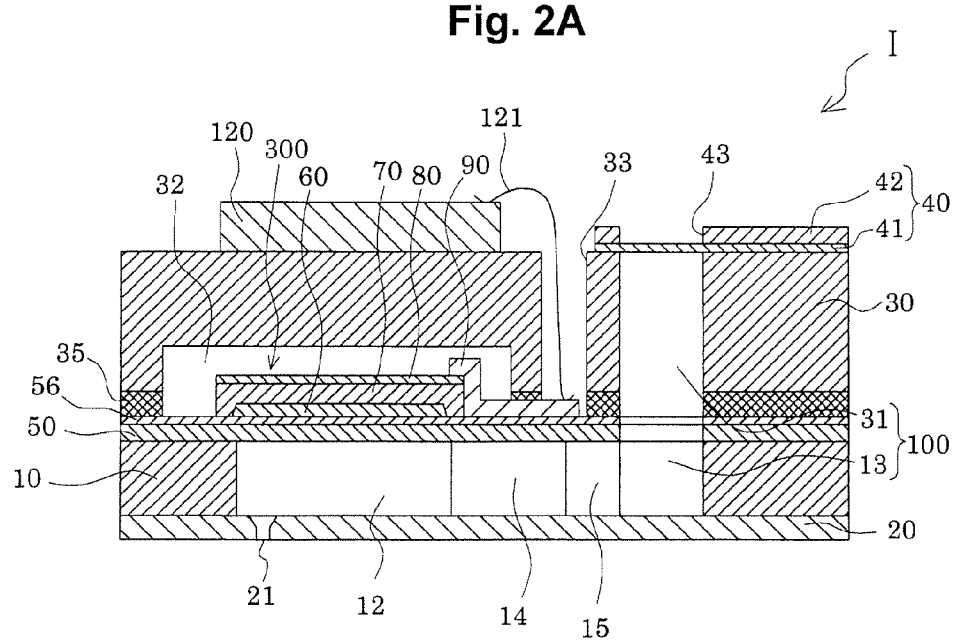
FIG. 2B is a cross sectional view of the recording head according to the first embodiment.

FIG. 1 is an exploded perspective view showing a simplified configuration of an inkjet recording head as an example of a liquid ejection head according to a first embodiment of the invention; and FIG. 2A is a plan view and FIG. 2B is a cross sectional view thereof across A-A'.

As shown in FIGS. 1 and 2, in the present embodiment there is provided a flow-defining substrate 10 made of a single-crystal silicon substrate with a resilient film 50 of silicon dioxide formed on one face.

A plurality of pressure generation chambers 12 are arrayed along the width direction of the flow-defining substrate 10. A communicating portion 13 is formed in a zone situated at the lengthwise outer ends of the pressure generation chambers 12 of the flow-defining substrate 10, and the communicating portion 13 communicates with the pressure generation chambers 12 via ink supply channels 14 and communicating channels 15 which are individually provided to the pressure generation chambers 12. The communicating portion 13 communicates with a reservoir portion 31 of a protective substrate, discussed later, and constitutes part of a reservoir which provides a common ink chamber for the pressure generation chambers 12. The ink supply channels 14 are narrower in width than the pressure generation chambers 12, and serve to maintain a given level of flow channel resistance of the ink inflowing to the pressure generation chambers 12 from the communicating portion 13. In the present embodiment, the ink supply channels 14 are formed by constricting the width of the flow channels from one side; however, the ink supply channels may also be formed by constricting the width of the flow channels from both sides. Alternatively, the ink supply channels may be constricted in the thickness direction rather than constricting the width of the flow channels. According to the present embodiment, the flow-defining substrate 10 is provided with liquid flow channels which include the pressure generation chambers 12, the communicating portion 13, the ink supply channels 14, and the communicating channels 15.

A nozzle plate 20 having nozzle openings 21 communicating at locations in proximity to the ends on the opposite side from the ink supply channels 14 in the pressure generation chambers 12 is affixed with an adhesive, thermal welding film, or other means, at the open face of the flow-defining substrate 10. The nozzle plate 20 may be made, for example, of glass-ceramics, a single-crystal silicon substrate, stainless steel, or the like.

Meanwhile, to the opposite side from the open face in this flow-defining substrate 10, the resilient film 50 is formed in the above manner, and over this resilient film 50 there is disposed an intimate adhesion layer 56 of titanium aluminum nitride (TiAlN) or the like intended to improve intimate adhesion of the resilient film 50 to the foundation of a first electrode 60. While TiAlN is used as the intimate adhesion layer 56 in the present embodiment, the material of the intimate adhesion layer 56 may differ depending on factors such as the type of first electrode 60 and the foundation for it; oxides or nitrides containing titanium, zirconium, or aluminum, or $SiO_2$, MgO, $CeO_2$, or the like may be used. Optionally, an insulator film of zirconium oxide or the like may be formed between the resilient layer and the intimate adhesion layer 56.

The first electrode 60, a piezoelectric layer 70 which is a thin film 3 μm or less, preferably between 0.3 and 1.5 μm, in thickness and preferentially oriented with the (110) plane (for example, 60% or more), and a second electrode 80, are built up over the intimate adhesion layer 56 to form a piezoelectric element 300. Here, the piezoelectric element 300 refers to the section that includes the first electrode 60, the piezoelectric layer 70, and the second electrode 80. Typically, either one of the electrodes of the piezoelectric element 300 is provided as a common electrode, while the other electrode and the piezoelectric layer 70 are patterned individually for each of the pressure generation chambers 12. In the present embodiment, the first electrode 60 is provided as the common electrode for the piezoelectric elements 300, while the second electrode 80 is an individual electrode provided to each of the piezoelectric elements 300; however, reversing this arrangement due to driver circuit or wiring considerations poses no particular difficulty. Here, the piezoelectric element 300 and the oscillator plate that gives rise to displacement driven by the piezoelectric element 300 are together termed an actuator unit. In the example described above, the resilient film 50, the intimate adhesion layer 56, and the first electrode 60, and the optional insulator film act as the oscillator plate; however, no limitation thereto is imposed, and the resilient film 50 and the intimate adhesion layer 56 need not be provided, for example. Alternatively, the piezoelectric element 300 may substantially double as the oscillator plate.

In the present embodiment, the piezoelectric layer 70 is made from a piezoelectric material containing a perovskite compound that includes bismuth manganate ferrate and barium titanate. A perovskite compound is a compound having the perovskite structure. This perovskite structure specifically produces an 8-faced body (octagon) of ABO₃ structure in which the A site has 12-fold oxygen coordination and the B site has 6-fold oxygen coordination. Bi or Ba are situated at the A sites, while Fe, Mn, or Ti is situated at the B sites.

Where the piezoelectric layer 70 is 3 μm or less in thickness, is made of a perovskite compound that includes bismuth manganate ferrate and barium titanate, and is preferentially oriented with the (110) plane, the piezoelectric layer will be lead-free yet have a high relative dielectric constant, as shown in the embodiments discussed later. Consequently, the piezoelectric layer 70 will have good piezoelectric characteristics such that, for example, the oscillator plate experiences large displacement at small voltages.

In preferred practice the piezoelectric layer 70 further contains $SiO_2$. It is hypothesized that this $SiO_2$ does not substitute onto the A sites or B sites in the perovskite compound, but rather is present as $SiO_2$ at grain boundaries of the perovskite compound formed, for example, by the bismuth manganate ferrate and the barium titanate (e.g., (Bi, Ba) (Fe, Mn, Ti)O₃). By including $SiO_2$ in the piezoelectric layer 70, the resultant piezoelectric element 300 will be lead-free and will have a high relative dielectric constant and excellent insulating properties, as shown in the embodiments discussed later. It is hypothesized that the reason for the excellent insulating properties is that the presence of $SiO_2$ at grain boundaries in the perovskite compound has the effect of inhibiting leak paths.

The perovskite compound contained in the piezoelectric layer 70 may contain other compounds having the perovskite structure, for example, $BiZn_{1/2}Ti_{1/2}O_3$, $(Bi_{1/2}K_{1/2})TiO_3$, $(Bi_{1/2}Na_{1/2})TiO_3$, or (Li, Na, K) (Ta, Nb)O₃.

No particular limitation is imposed as to the ratio of Fe and Mn of the bismuth manganate ferrate which is the principal component of the perovskite compound, and the level of Mn may be more than 1 mol % but less than 10 mol % of the total molar quantity of Fe and Mn. Nor is any particular limitation imposed as to the proportions of bismuth manganate ferrate, barium titanate, or the optional $SiO_2$. For example, the level of bismuth manganate ferrate is more than 60 mol %, and preferably at least 70 mol % but not more than 80 mol %, with respect to the perovskite compound, more specifically to the total molar quantity of bismuth manganate ferrate, barium titanate, etc. Consequently, the proportion of compounds having the perovskite structure such as barium titanate is less than 40 mol % in the perovskite compound. Such a perovskite compound composed, for example, of bismuth manganate ferrate and barium titanate is represented by Equation (1) below.

$$xBi(Fe_{1-a},Mn_a)O_3\text{-}yBaTiO_3 \quad (1)$$

(0.06<x<1, 0<y<0.40, and preferably 0.70≤x≤0.80, 0.20≤y≤0.30, x+y=1, and 0.01<a<0.10.)

While no particular limitation is imposed as to the level of $SiO_2$ where included in the piezoelectric layer 70, the piezoelectric layer 70 may be made of piezoelectric material containing at least 0.5 mol % but no more than 5 mol %, preferably at least 1.5 mol % but no more than 2.5 mol %, with respect to the perovskite compound.

No particular limitation is imposed as to the method of forming such piezoelectric elements 300 on the flow-defining substrate 10, and the elements may be manufactured by the following method, for example. First, a silicon dioxide film of silicon dioxide ($SiO_2$) or the like constituting the resilient film 50 is formed on the surface of the wafer that used for the flow-defining substrate, which is a silicon wafer. Next, the intimate adhesion layer 56 of titanium aluminum nitride or the like is formed over the resilient film 50 (silicon dioxide film).

Next, the first electrode 60 composed of platinum, iridium, iridium oxide, or a stacked layer structure thereof is formed over the entire face of the intimate adhesion layer 56 by a sputtering process or the like, and then patterned.

Next, the piezoelectric layer 70 is built up. No particular limitation is imposed as to the method of manufacture of the piezoelectric layer 70, but the piezoelectric layer 70 may be formed, for example, using a metal-organic decomposition (MOD) method involving dissolving/dispersing a metal compound in a solvent then applying and drying the solution, followed by baking at high temperature to obtain a piezoelectric layer 70 made of metal oxide. The method of manufacture of the piezoelectric layer 70 is not limited to MOD, and other methods, for example, chemical solution methods such as the sol-gel method, laser ablation methods, sputtering methods, pulsed laser deposition (PLD) methods, CVD methods, aerosol deposition methods, and the like may be used as well.

For example, a sol or MOD solution (precursor solution) that contains a desired composition ratio of metal compounds, specifically, metal compounds including Bi, Fe, Mn, Ba, and Ti, and that optionally contains added $SiO_2$, is applied onto the first electrode 60 by a spin coating method, etc., to form a piezoelectric precursor film (coating step).

The coated precursor solution is prepared by combining metal compounds that respectively include Bi, Fe, Mn, Ba, and Ti so as to give the desired molar ratios of each metal, and dissolving or dispersing the mixture into an organic solvent such as an alcohol. As metal compounds respectively including Bi, Fe, Mn, Ba, and Ti there may be employed, for example, metal alkoxides, salts of organic acids, β diketone complexes, and the like. Examples of metal compounds containing Bi include bismuth benzoate, bismuth oxyacetate, bismuth octylate, bismuth octanoate, bismuth citrate, bismuth acetate, tri-t-amyloxy bismuth, triethoxy bismuth, tris (dipivaloylmethanate) bismuth, triphenyl bismuth, and tri-i-propoxide bismuth. Examples of metal compounds containing Fe include iron octylate, iron octanoate, iron formate, iron stearate, triethoxy iron, iron tris(acetylacetonate), tri-i-propoxy iron, and the like. Examples of metal compounds containing Mn include manganese octylate, manganese octanoate, manganese acetate, manganese acetylacetonate, and the like. Examples of metal compounds containing Ba include barium benzoate, barium octanoate, barium octylate, barium oleate, barium formate, barium citrate, barium acetate, barium oxalate, barium tartrate, diethoxy barium, di-i-butoxy barium, di-n-butoxy barium, di-sec-butoxy barium, di-t-butoxy barium, di-i-propoxy barium, di-n-propoxy barium, dimethoxy barium, barium hydroxide, barium thiocyanate, barium naphthenate, barium lactate, barium dipivaloylmethanate, barium di(methoxyethoxide), bis (acetylacetonate)diaqua barium, bis(dipivaloylmethanate) barium, barium propionate, and barium laurate. Examples of metal compounds containing Ti include titanium octylate, titanium octanoate, titanium oleate, di(isopropoxy) bis(dipivaloylmethanate) titanium, tetraethoxy titanium, tetrakisdiethylamino titanium, tetrakis(dimethylamino) titanium, tetra-n-butoxy titanium, tetra-i-butoxy titanium, tetra-sec-butoxy titanium, tetra-t-butoxy titanium, tetra-i-propoxy titanium, tetra-n-propoxy titanium, tetramethoxy titanium, and the like. Solvents for the precursor solution include propanol, butanol, pentanol, hexanol, octanol, ethylene glycol, propylene glycol, octane, decane, cyclohexane, xylene, toluene, tetrahydrofuran, acetic acid, octylic acid, and the like.

In preferred practice, the precursor solution is one that includes iron octylate. Where iron octylate is included, simply by forming a piezoelectric precursor film by coating or the like and bringing about crystallization thereof by heating, a piezoelectric layer 70 that is preferentially oriented with the (110) plane can be formed through spontaneous orientation, that is, without an operation to orient the material under an applied magnetic field, or an operation involving providing the foundation of the piezoelectric layer 70 with a layer for controlling orientation, or the like. The precursor solution including iron octylate may be a precursor solution containing added iron octylate per se as the iron source, or one in which a metal compound other than iron octylate is used as the iron source, and a precursor solution for coating purposes that contains iron octylate is obtained through ligand substitution by the solvent or the like. In case of a precursor solution that does not include iron octylate, for example, one including iron tris(acetylacetonate) as described in the comparative examples discussed later, coating of the precursor solution and bringing about crystallization of the piezoelectric precursor film by heating does not bring about a piezoelectric layer 70 that is preferentially oriented with the (110) plane.

In addition, adjusting the ligands of the elements by changing the solvent or metal compounds or varying the ratio of the elemental Bi, Fe, Mn, Ba and Ti in the precursor solution makes it possible to adjust the degree to which the (110) plane of the piezoelectric layer 70 is oriented.

Next, the piezoelectric precursor film is heated to prescribed temperature and dried for a given duration (drying step). Next, the dried piezoelectric precursor film is heated to a prescribed temperature and held for a given duration to bring about degreasing (degreasing step). Here, degreasing refers to driving off organic components contained in the piezoelectric precursor film, for example, $NO_2$, $CO_2$, $H_2O$, and so on.

Next, the piezoelectric precursor film is heated to prescribed temperature, for example between 600° C. and 700° C., and held for a given duration to bring about crystallization and form the piezoelectric film (baking step). The heating unit used in the drying step, degreasing step, and baking step may be a rapid thermal annealing (RTA) unit designed to heat by irradiation with a UV lamp, or a hot plate or other device.

Optionally, the aforementioned coating step, drying step, and degreasing step or the coating step, drying step, degreasing step, and baking step may be repeated multiple times depending on factors such as desired film thickness, to form a piezoelectric layer composed of a multilayer piezoelectric film.

After the piezoelectric layer 70 has been formed, the second electrode 80 layer is formed from a metal such as platinum, for example, over the piezoelectric layer 70; and the piezoelectric layer 70 and the second electrode 80 are then patterned simultaneously to form the piezoelectric element 300.

Optionally, a subsequent post-anneal may be carried out at a temperature range of between 600° C. and 700° C. By so doing, a good interface can be formed between the piezoelectric layer 70 on the one hand and the first electrode 60 and second electrode 80 on the other, and the crystallinity of the piezoelectric layer 70 may be improved.

A more detailed description of the present invention is given below based on the preferred working examples. The invention is not limited to the working examples hereinbelow.

First Working Example

First, an $SiO_2$ film having film thickness of 400 nm was formed by thermal oxidation of the surface of a silicon substrate. Next, using an RF sputtering method, a TiAlN film having film thickness of 100 nm was formed over the $SiO_2$ film. Next, using a DC sputtering method, an Ir film having film thickness of 100 nm and an $IrO_2$ film having film thickness of 30 nm were formed successively over the TiAlN film, and a Pt film oriented in the (111) plane was formed thereon by a vapor deposition method, to form the first electrode 60.

Next, a piezoelectric layer was formed on the first electrode by a spin coating method. The method is as follows. First, metal compounds of Bi, Fe, Mn, Ba, Ti, and Si, more specifically bismuth octylate, iron octylate, manganese octylate, barium octylate, titanium octylate, and $SiO_2$, together with an octane solvent, are mixed in prescribed proportions to prepare a precursor solution. In the resultant solution the total number of moles of Bi, Fe, Mn, Ba, and Ti was 0.25 mol/L. This precursor solution was dripped onto the substrate on which the TiAlN film and the first electrode were formed, and the substrate was then spun at 1,500 rpm to form a piezoelectric precursor film (coating step). Next, drying/degreasing were carried out for 3 minutes at 350° C. (drying and degreasing step). After repeating this coating step and drying and degreasing step three times, baking was carried by rapid thermal annealing (RTA) for one minute at 650° C. (baking step). After repeating four times a process of carrying out the coating step and drying and degreasing step three times followed by a baking step of baking the entire layer, baking was carried out by RTA for 10 minutes at 650° C. to form a piezoelectric layer 70 having total thickness of 800 nm by a total of 12 successive coatings.

Subsequently, after forming a platinum film 100 nm in thickness as the second electrode 80 on the piezoelectric layer 70 by a DC sputtering method, baking was carried out by RTA for 10 minutes at 650° C. to form a piezoelectric element 300 of a piezoelectric layer 70 of piezoelectric material containing a perovskite compound having the compositional ratio 0.75 Bi $(Fe_{0.95}Mn_{0.05})$ $O_3$-0.25 $BaTiO_3$, and 2 mol % $SiO_2$ with respect to the perovskite compound.

Second Working Example

A piezoelectric element 300 was formed analogously to the first working example, except that the Si compound was not added to the precursor solution, and the piezoelectric material of the piezoelectric layer 70 was composed of the perovskite compound 0.75 $Bi(Fe_{0.95}Mn_{0.05})$ $O_3$-0.25 $BaTiO_3$.

Third Working Example

A piezoelectric element 300 was formed analogously to the second working example, except that the mixture proportions of the Bi, Fe, Mn, Ba, and Ti metal compounds were changed to give a piezoelectric layer 70 composed of a piezoelectric material having the perovskite compound 0.80 $Bi(Fe_{0.95}Mn_{0.05})$ $O_3$-0.20 $BaTiO_3$.

Fourth Working Example

A piezoelectric element 300 was formed analogously to the second working example, except that the mixture proportions of the Bi, Fe, Mn, Ba, and Ti metal compounds were changed to give a piezoelectric layer 70 composed of a piezoelectric material having the perovskite compound 0.70 $Bi(Fe_{0.95}Mn_{0.05})$ $O_3$-0.30 $BaTiO_3$.

First Comparative Example

A piezoelectric element 300 was formed analogously to the first working example, except that the mixture proportions of the Bi, Fe, Mn, Ba, Ti, and Si metal compounds were changed to give a piezoelectric layer 70 composed of a piezoelectric material having the perovskite compound 0.60 $Bi(Fe_{0.95}Mn_{0.05})O_3$-0.40 $BaTiO_3$, and 2 mol % $SiO_2$ with respect to the perovskite compound.

Second Comparative Example

A piezoelectric element 300 was formed analogously to the second working example, except that iron tris(acetylacetonate) was used in place of the iron octylate.

First Test Example

Figure 3:
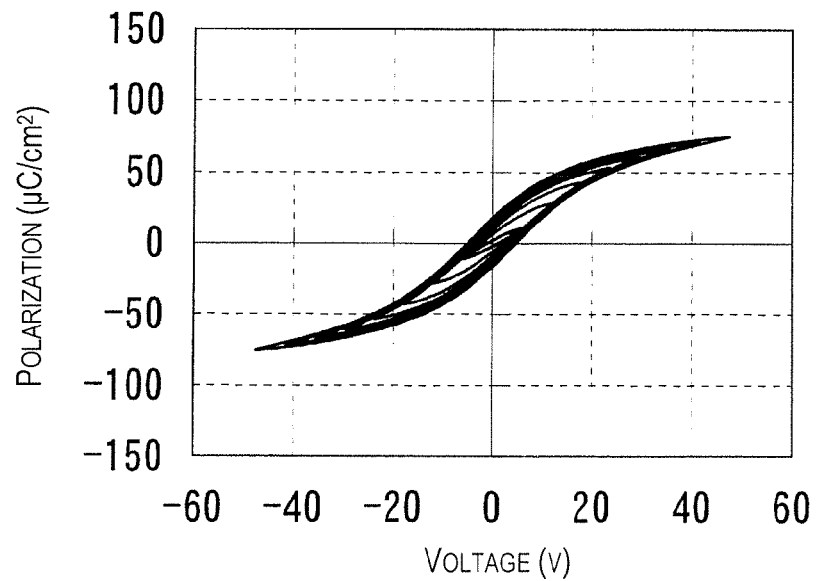
FIG. 3 is a drawing depicting a P-V curve in a first embodiment.
Figure 4:
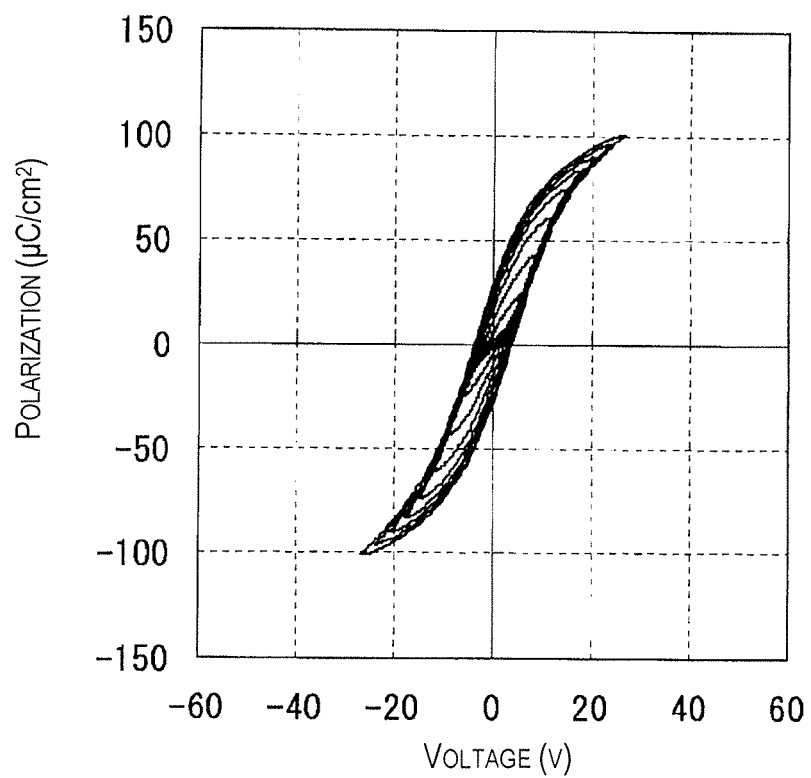
FIG. 4 is a drawing depicting a P-V curve in a second embodiment.
Figure 5:
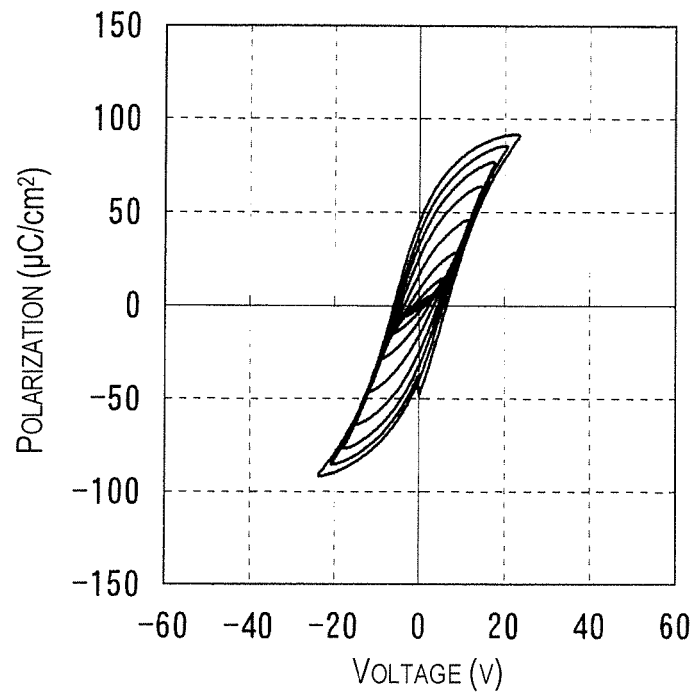
FIG. 5 is a drawing depicting a P-V curve in a third embodiment.
Figure 6:
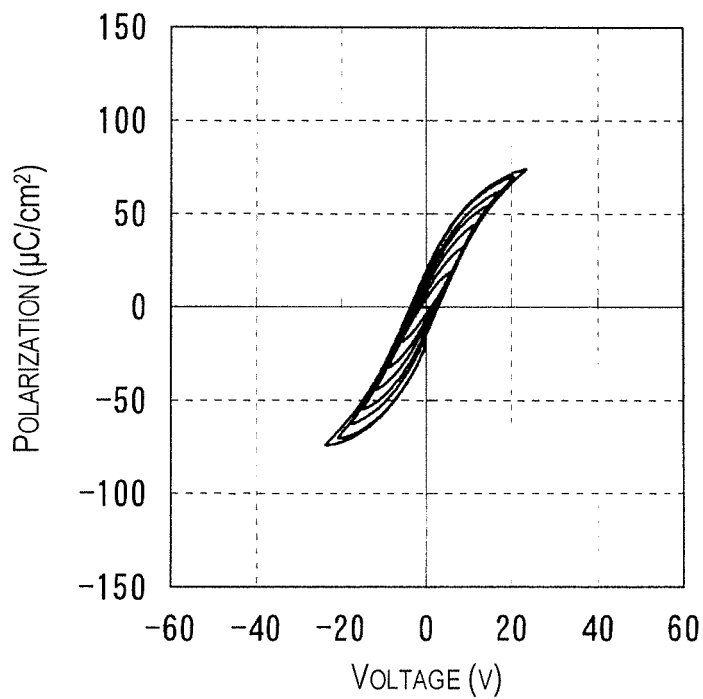
FIG. 6 is a drawing depicting a P-V curve in a fourth embodiment.
Figure 7:
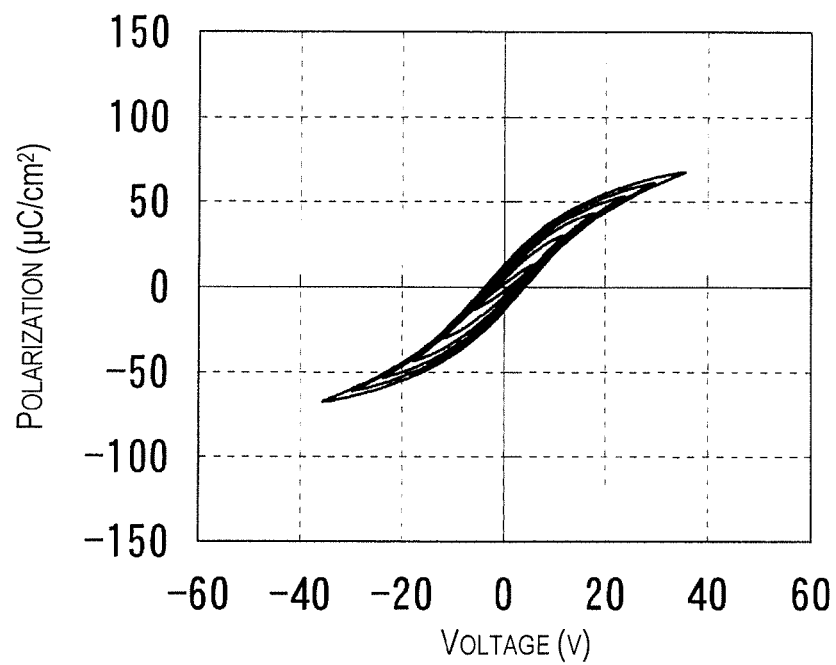
FIG. 7 is a drawing depicting a P-V curve in a first comparative example.
Figure 8:
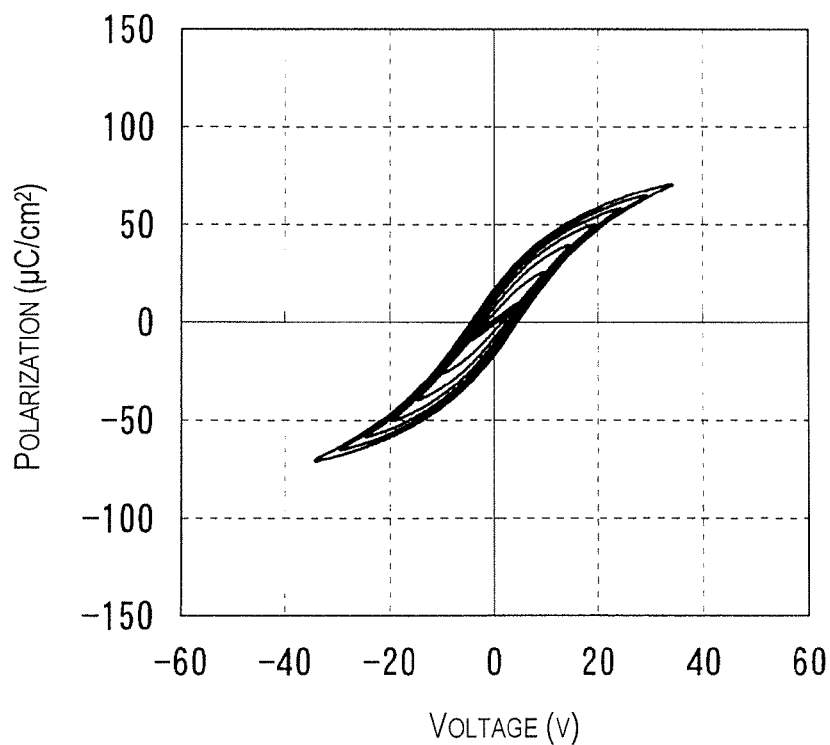
FIG. 8 is a drawing depicting a P-V curve in a second comparative example.

For each of the piezoelectric elements 300 of the first to fourth working examples and the first and second comparative examples, using an FCE-1A made by Toyo Corporation and a φ=400 μm electrode pattern, a 3 V to 60 V triangular wave having frequency of 1 kHz was applied and the P (polarization)–V (voltage) relationship was calculated. The hysteresis loop of the first working example is shown in FIG. 3, the hysteresis loop of the second working example is shown in FIG. 4, the hysteresis loop of the third working example is shown in FIG. 5, the hysteresis loop of the fourth working example is shown in FIG. 6, the hysteresis loop of the first comparative example is shown in FIG. 7, and the hysteresis loop of the second comparative example is shown in FIG. 8. As shown in FIGS. 3 to 8, the piezoelectric layers of the first to fourth working examples and of the first and second comparative examples are ferroelectrics.

As a result, polarization was greater in the first to fourth working examples as compared with the first and second comparative examples. In the first working example, a good hysteresis curve was obtained up to 51 V. It was therefore demonstrated that the first working example affords excellent insulation properties.

Second Test Example

Figure 9:
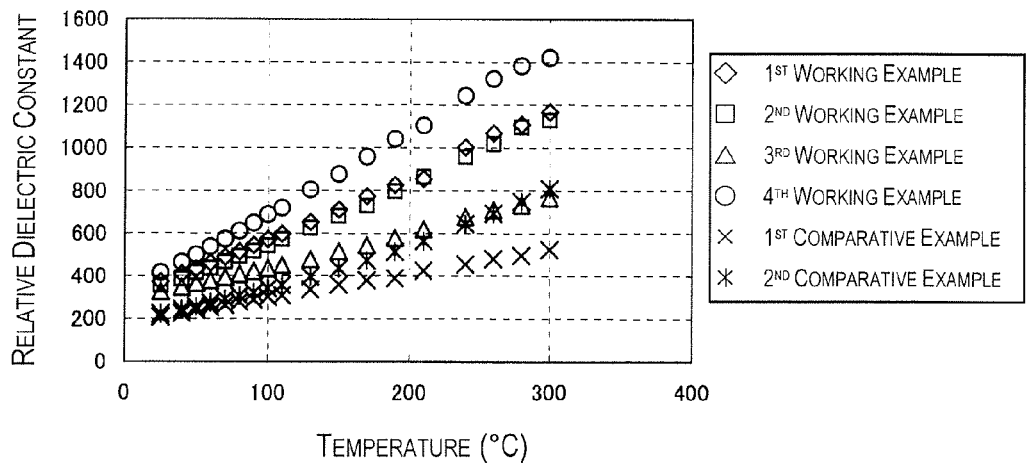
FIG. 9 is a drawing depicting measurements of relative dielectric constant.

For each of the piezoelectric elements 300 of the first to fourth working examples and the first and second comparative examples, using an impedance analyzer HP4294A made by Agilent, relative dielectric constant was measured at between 25° C. and 300° C. under conditions of 1 kHz and 141 mV amplitude. Results are shown in FIG. 9. As shown in FIG. 9, the piezoelectric layer 70 in the first to fourth working examples had markedly higher relative dielectric constant as compared with the first and second comparative examples, and relative dielectric constant was 320 or above. Specifically, as shown in FIG. 9, relative dielectric constant at 25° C. was 370 for the first working example, 355 for the second working example, 325 for the third working example, and 415 for the fourth working example, versus 205 for the first comparative example and 220 for the second comparative example.

Third Test Example

Figure 10:
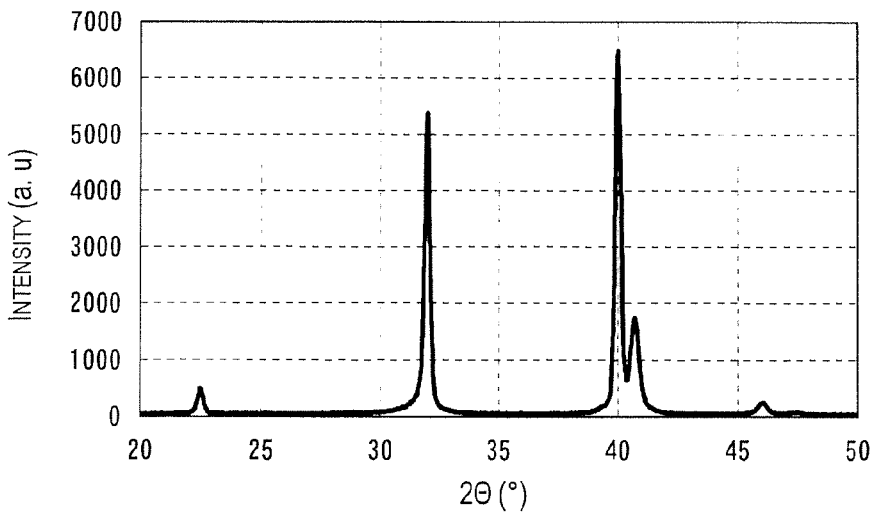
FIG. 10 is a drawing showing an XRD pattern in the first embodiment.
Figure 11:
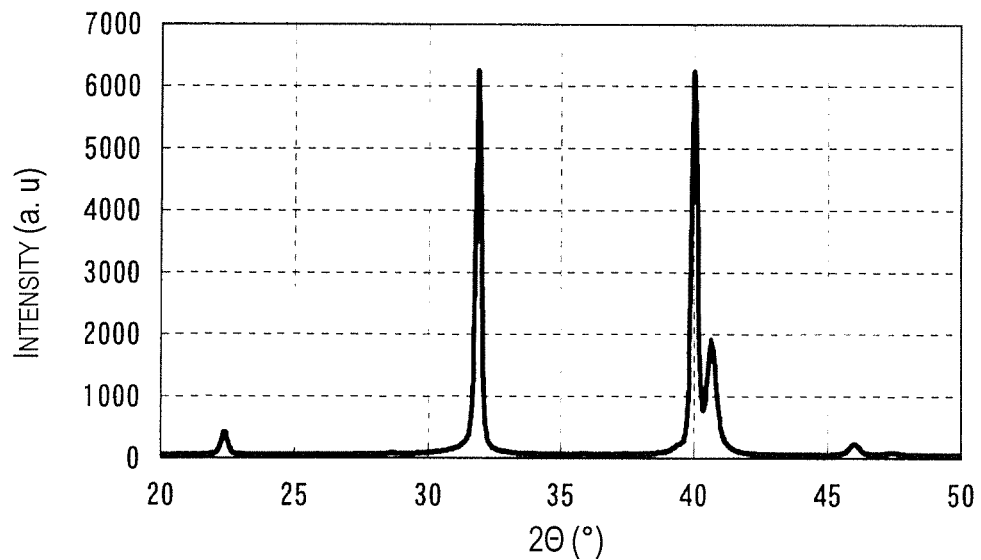
FIG. 11 is a drawing showing an XRD pattern in the second embodiment.
Figure 12:
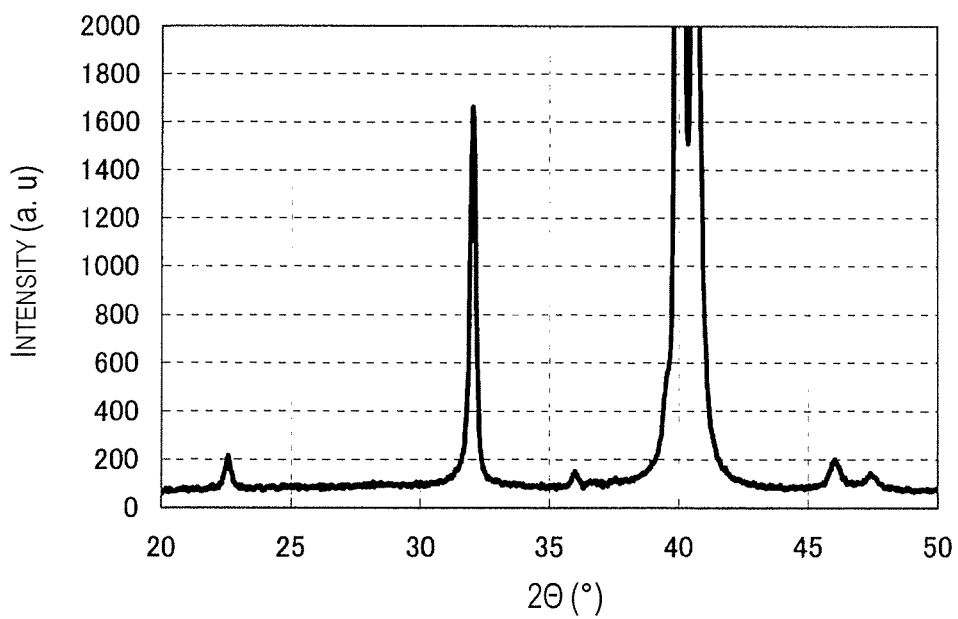
FIG. 12 is a drawing showing an XRD pattern in the third embodiment.
Figure 13:
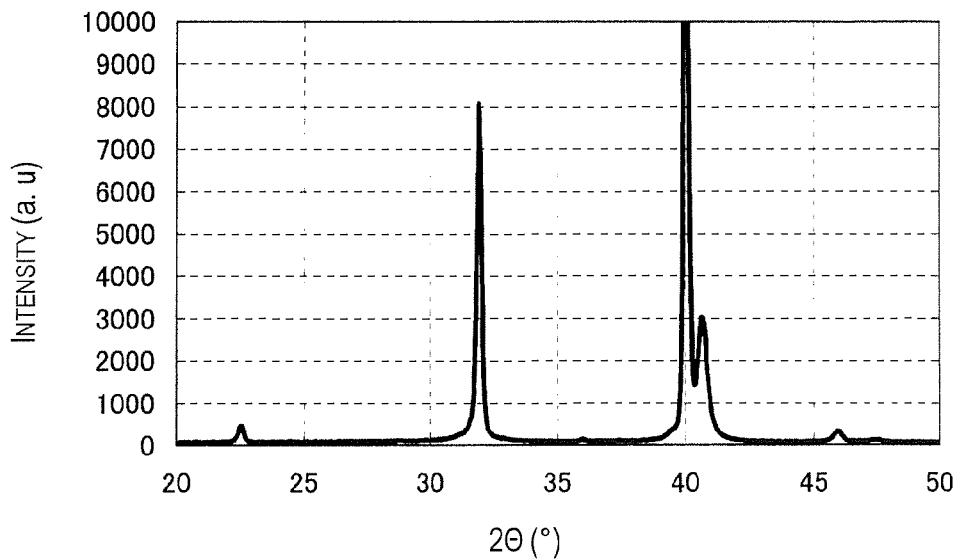
FIG. 13 is a drawing showing an XRD pattern in the fourth embodiment.
Figure 14:
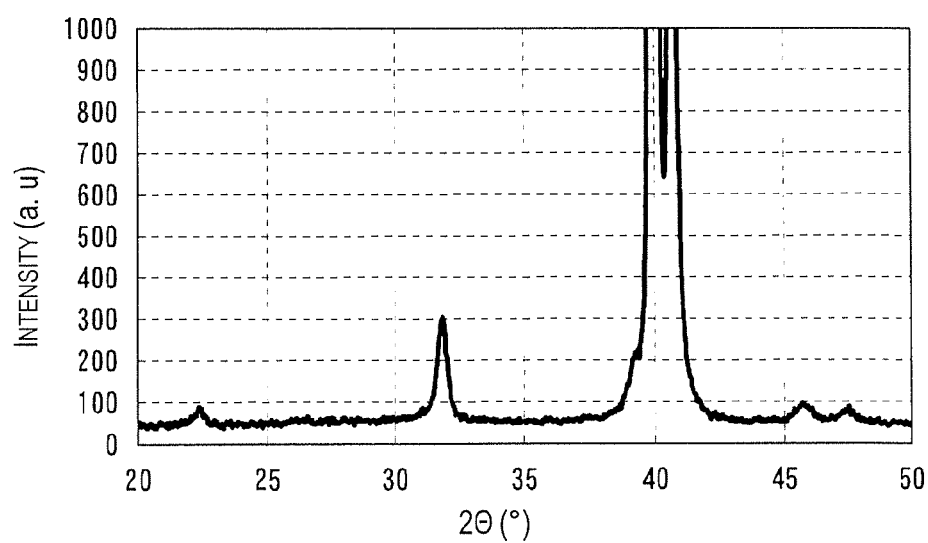
FIG. 14 is a drawing showing an XRD pattern in the first comparative example.
Figure 15:
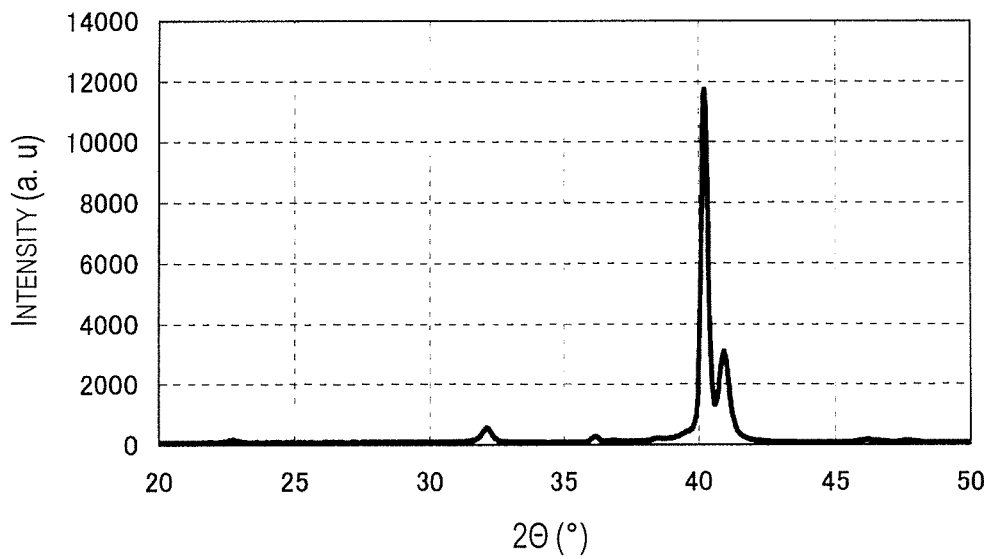
FIG. 15 is a drawing showing an XRD pattern in the second comparative example.
Figure 16:
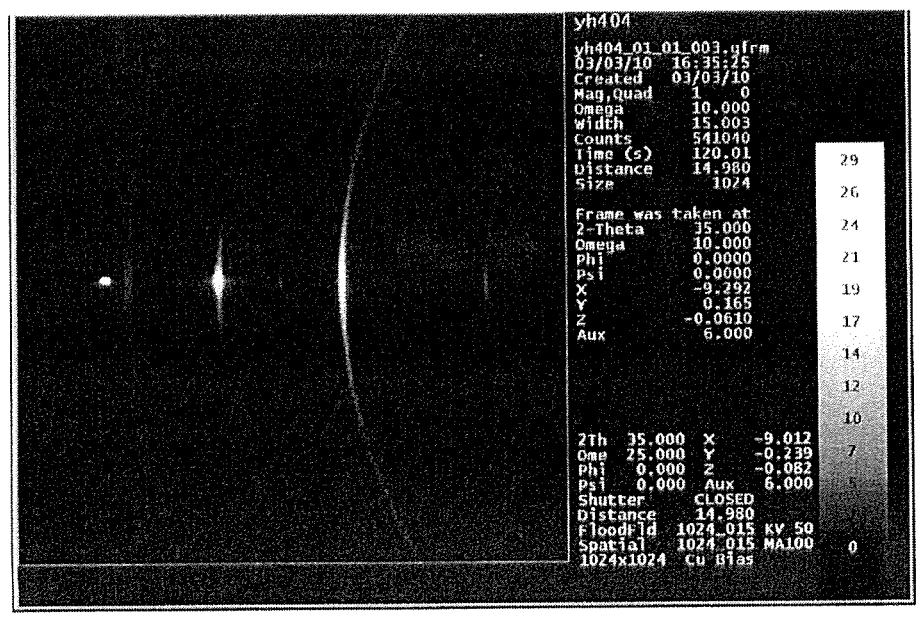
FIG. 16 is a 2-dimensional sensed image in the first embodiment.

For each of the piezoelectric elements of the first to fourth working examples and the first and second comparative examples, using a D8 Discover made by Bruker AXS and CuKα rays as the X-ray source, the powder X-ray diffraction patterns of the piezoelectric layers at room temperature were calculated at φ=ψ=0°. Results for the first working example are shown in FIG. 10, results for the second working example in FIG. 11, results for the third working example in FIG. 12, results for the fourth working example in FIG. 13, results for the first comparative example in FIG. 14, and results for the second comparative example in FIG. 15. An example of a 2-dimensional sensed image for the first working example is shown in FIG. 16.

As a result, in all of the first to fourth working examples and the first and second comparative examples, the perovskite structure ($ABO_3$ structure) was observed to form as shown in FIGS. 10 to 15. The peaks attributed to the piezoelectric layer were one attributed to the (100) plane, observed in proximity to 2θ=22.30 to 22.60°, and one attributed to the (110) plane, observed in proximity to 2θ=31.80 to 32.00°. When the degree of orientation of the peak attributed to the (110) plane was calculated from the area ratio of the peak attributed to the (110) plane to the sum of the peak attributed to the (100) plane and the peak attributed to the (110) plane, the value was 64% in the first working example, 77% in the second working example, 68% in the third working example, and 73% in the fourth working example. Thus, these values were 60% or above for the first to fourth working examples, showing that all of the oriented films were preferentially oriented with the (110) plane. On the other hand, the orientation of the (110) plane in the first comparative example was approximately 36%, and the orientation of the (110) plane in the second comparative example using a precursor solution not containing iron octylate was approximately 42%, showing that in neither example were the films preferentially oriented with the (110) plane. The peak attributed to the (111) plane observed in proximity to 2θ=40° is attributed not to the piezoelectric layer but instead to the platinum film of the foundation, and by observing the 2-dimensional sensed image of FIG. 16 in the ψ-2θ direction, it may be appreciated that the (111) plane peak of the piezoelectric layer of the first working example is extremely small.

From the results of these test examples, it may be appreciated that in the first to fourth working examples, in which the piezoelectric layer is 3 μm or less in thickness, is preferentially oriented with the (110) plane, and is composed of a piezoelectric material containing a perovskite compound including bismuth manganate ferrate and barium titanate, the relative dielectric constant is markedly higher and the piezoelectric characteristics are better, as compared with the first and second comparative examples which are not preferentially oriented with the (110) plane.

To the second electrodes 80 provided as the individual electrodes of the piezoelectric element 300 there are connected lead electrodes 90 of gold (Au) for example, which lead out from the proximity of the end on the ink supply channel 14 side and extend as far as the intimate adhesion layer 56.

A protective substrate 30 having a reservoir portion 31 that defines at least part of a reservoir 100 is joined through the agency of an adhesive 35 over the flow-defining substrate 10 having these piezoelectric elements 300 formed thereon, and more specifically over the first electrode 60, the intimate adhesion layer 56, and the lead electrodes 90. According to the present working example, this reservoir portion 31 passes through the protective substrate 30 in the thickness direction and extends across the width direction of the pressure generation chambers 12 to constitute the reservoir 100 which communicates with the communicating portion 13 of the flow-defining substrate 10, and serves as the common ink chamber for the pressure generation chambers 12 as described previously. Optionally, the communicating portion 13 of the flow-defining substrate 10 may be divided into multiple partitions for the individual pressure generation chambers 12, and only the reservoir portion 31 used as the reservoir. Alternatively, for example, the flow-defining substrate 10 may be provided with pressure generation chambers 12 only, and a component interposed between the flow-defining substrate 10 and the protective substrate 30 (for example, the resilient film 50, the intimate adhesion layer 56, etc.) may be provided with the ink supply channels 14 for connecting the reservoir with the pressure generation chambers 12.

An area of the protective substrate 30 facing towards the piezoelectric elements 300 is provided with a piezoelectric element retaining portion 32 having space sufficient to not impede movement of the piezoelectric elements 300. While the piezoelectric element retaining portion 32 must have space sufficient to not impede movement of the piezoelectric elements 300, the space may be sealed, or not sealed.

The protective substrate 30 is preferably made of material with a coefficient of thermal expansion substantially identical to the flow-defining substrate 10, for example, glass, ceramic materials, or the like. In the present working example, a single-crystal silicon substrate of material substantially identical to the flow-defining substrate 10 is used.

A passage hole 33 that passes through the protective substrate 30 in the thickness direction is provided in the protective substrate 30. The lead electrodes 90 which lead out from the piezoelectric elements 300 are disposed such that an area in proximity to the ends of the electrodes lies exposed within the passage hole 33.

A driver circuit 120 for driving the array of piezoelectric elements 300 is fastened over the protective substrate 30. A circuit board, a semiconductor integrated circuit (IC), or the like may be used as this driver circuit 120. The driver circuit 120 and the lead electrodes 90 are electrically connected via connecting lines 121 of conductive wires such as bonding wires.

A compliance substrate 40 composed of a sealing film 41 and a fastener plate 42 is joined onto the protective substrate 30. Here, the sealing film 41 is made of a pliable material with low rigidity, and one face of the reservoir portion 31 is sealed by this sealing film 41. The fastener plate 42 is made of relatively hard material. An area of the fastener plate 42 facing the reservoir 100 constitutes an opening portion 43 where material has been completely removed in the thickness direction, and therefore the one face of the reservoir 100 is sealed by the pliable sealing film 41 exclusively.

According to the inkjet recording head I of the present working example, ink is drawn in through an ink introduction port that is connected to external ink supply means, not shown; and after the interior has filled with ink from the reservoir 100 to the nozzle openings 21, in accordance with a recording signal from the driver circuit 120, voltage is applied across the first electrodes 60 and the second electrodes 80 respectively corresponding to the pressure generation chambers 12, to induce the resilient film 50, the intimate adhesion layer 56, the first electrode 60, and the piezoelectric layer 70 to experience flexural deformation and thereby elevate the pressure inside the pressure generation chambers 12 and expel ink droplets.

Additional Embodiments

While the present invention has been described in terms of certain preferred working examples, the basic configuration of the invention is not limited to those discussed above. For example, piezoelectric layers may be made from piezoelectric materials that additionally contain Ni, Co, Cr, Sc, V or the like, for the purpose of improving piezoelectric characteristics.

While the preceding working examples depicted examples using a single-crystal silicon substrate as the flow-defining substrate 10, no particular limitation to this is imposed, and optionally, other semiconductor substrates such as Ge, transparent crystalline substrates such as $SrTiO_3$, $InSnO_3$, ZnO, $Al_2O_3$, or $SiO_2$, glass substrates, metal substrates such as stainless steel or Ti, SOI substrates, or the like may be used instead.

Further, while the preceding working examples depicted examples of piezoelectric elements 300 formed by sequential stacking of the first electrode 60, the piezoelectric layer 70, and the second electrodes 80 on the substrate (flow-defining substrate 10), no particular limitation to this is imposed, and the invention may be implemented, for example, in piezoelectric elements of longitudinal oscillating type composed of alternating stacked layers of piezoelectric material and electrode-forming material that expand and contract in the axial direction.

Figure 17:
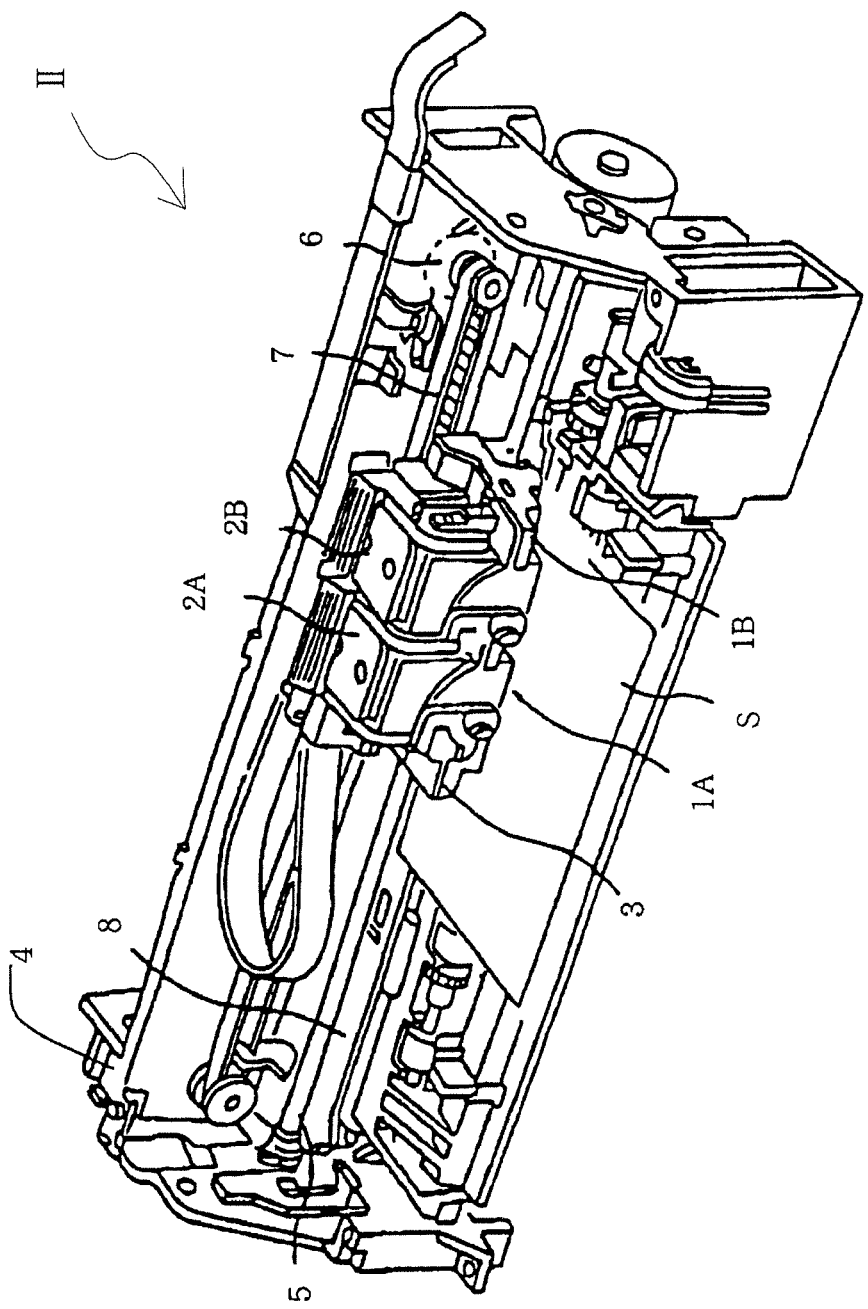
FIG. 17 is a drawing showing a simplified configuration of a recording device according to an embodiment of the invention.

The inkjet recording heads of these working examples constitute part of a recording head unit provided with ink channels that communicate with an ink cartridge or the like, and are installed in an inkjet recording device. FIG. 17 is a schematic diagram showing an example of such an inkjet recording device.

In the inkjet recording device II shown in FIG. 17, cartridges 2A and 2B are detachably installed in recording head units 1A and 1B provided as ink supply means and furnished with the inkjet recording head I. A carriage 3 on which these recording head units 1A and 1B are mounted is movably disposed in the axial direction on a carriage rail 5 that is attached to a device chassis 4. The recording head units 1A and 1B respectively eject a black ink composition and color ink compositions, for example.

The carriage 3 on which the recording head units 1A and 1B are mounted travels along the carriage rail 5 through transmission of drive power from a drive motor 6 to the carriage 3 via a number of gears, not shown, and a timing belt 7. The device chassis 4 has a platen 8 which is disposed along the carriage rail 5, and a recording sheet S of a recording medium such as paper which is supplied by feed rollers, not shown, or the like is advanced while wound around the platen 8.

While the preceding first working example described an inkjet recording head by way of an example of a liquid ejection head, the present invention is directed generally to all manner of liquid ejection devices, and, as shall be apparent, may be implemented in liquid ejection heads that eject liquids other than ink. Examples of other liquid ejection heads are recording heads of various kinds used in image recording devices such as printers; color material ejection heads used in the manufacture of color filters for liquid crystal displays and the like; electrode material ejection heads used for electrode formation in organic EL displays, field emission displays (FED), and the like; and bioorganic compound ejection heads used in the manufacture of biochips.

The present invention is not limited to piezoelectric elements mounted on liquid ejection heads typified by inkjet recording heads, and may be implemented analogously in piezoelectric elements for ultrasound transmitters and other ultrasound devices, ultrasound motors, or infrared sensors, ultrasound sensors, heat sensitive sensors, pressure sensors, pyroelectric sensors, acceleration sensors, gyro sensors, and various other types of sensors. Further, the present invention may be implemented analogously in ferroelectric elements such as ferroelectric memory, or in micro liquid pumps, thin ceramic capacitors, gate insulating films, and the like.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A liquid ejection head comprising:
   a piezoelectric element having a piezoelectric layer and electrodes, wherein
   the piezoelectric layer is 3 μm or less in thickness,
   the piezoelectric layer being made of a piezoelectric material including at least bismuth manganate ferrate and barium titanate, and
   the piezoelectric layer being preferentially oriented with the (110) plane,
   an area ratio of a peak attributed to the (110) plane to a sum of a peak attributed to a (100) plane and the peak attributed to the (110) plane being more than 60% in X-ray diffraction patterns of the piezoelectric layer, the peak attributed to the (100) plane being larger than zero.

2. The liquid ejection head according to claim 1, wherein the electrodes include a platinum film oriented with the (111) plane, and the piezoelectric layer is formed on the platinum film.

3. The liquid ejection head according to claim 1, wherein the piezoelectric layer is a spontaneously oriented film.

4. The liquid ejection head according to claim 1, wherein the piezoelectric material further includes $SiO_2$.

5. The liquid ejection head according to claim 4, wherein the piezoelectric layer contains $SiO_2$ in an amount of 0.5 mol % or more and 5 mol % or less.

6. A liquid ejection device comprising the liquid ejection head according to claim 1.

* * * * *